United States Patent [19]

Heimbigner et al.

[11] 4,229,667
[45] Oct. 21, 1980

[54] VOLTAGE BOOSTING SUBSTRATE BIAS GENERATOR

[75] Inventors: Gary L. Heimbigner, Anaheim; Robert K. Booher, El Toro, both of Calif.

[73] Assignee: Rockwell International Corporation, El Segundo, Calif.

[21] Appl. No.: 937,038

[22] Filed: Aug. 23, 1978

[51] Int. Cl.³ .......................... H03L 1/00; H03K 3/00
[52] U.S. Cl. ............................... 307/297; 307/200 B; 307/304
[58] Field of Search ............... 307/200 B, 296, 297, 307/304, 350, 359, 362, 363, DIG. 1, DIG. 4; 328/173, 175, 176

[56] References Cited

U.S. PATENT DOCUMENTS

| | | | |
|---|---|---|---|
| 3,609,414 | 9/1971 | Pleshko et al. | 307/310 |
| 3,805,095 | 4/1974 | Lee et al. | 307/304 |
| 3,806,741 | 4/1974 | Smith | 307/350 X |
| 4,016,476 | 4/1977 | Morokawa et al. | 307/DIG. 4 X |
| 4,049,980 | 9/1977 | Maitland | 307/297 X |
| 4,115,710 | 9/1978 | Lou | 307/200 B X |
| 4,123,671 | 10/1978 | Aihara et al. | 307/DIG. 4 X |
| 4,142,114 | 2/1979 | Green | 307/297 X |

FOREIGN PATENT DOCUMENTS 2422653 1/1975 Fed. Rep. of Germany .... 307/DIG. 4
2365581 9/1975 Fed. Rep. of Germany .... 307/DIG. 4

OTHER PUBLICATIONS

"Fast Mostek ROM", *Electronics*, pp. 42 & 42, 9/16/76.
Kubo et al., *Proceedings of the 1976 IEEE Int'l. Solid State Circuits Conference*, pp. 54–55; 2/18/76.
Blaser et al., *Proceedings of the 1976 IEEE Int'l. Solid State Circuits Conf.*, pp. 56–57; 2/18/76.
Pashley et al., "Speedy RAM Runs Cool with Power--Down Circuitry", *Electronics*, pp. 103–107; 8/4/77.

*Primary Examiner*—Larry N. Anagnos
*Attorney, Agent, or Firm*—H. Frederick Hamann; Morland C. Fischer

[57] ABSTRACT

An "on chip" substrate bias generator circuit to automatically compensate for threshold variations of devices that form a MOS circuit. The substrate bias generator includes a voltage doubler (or trippler) to develop a wide range of negative bias voltage to be fed back via the substrate to the MOS circuit to provide uniform bias control of the circuit devices.

5 Claims, 1 Drawing Figure

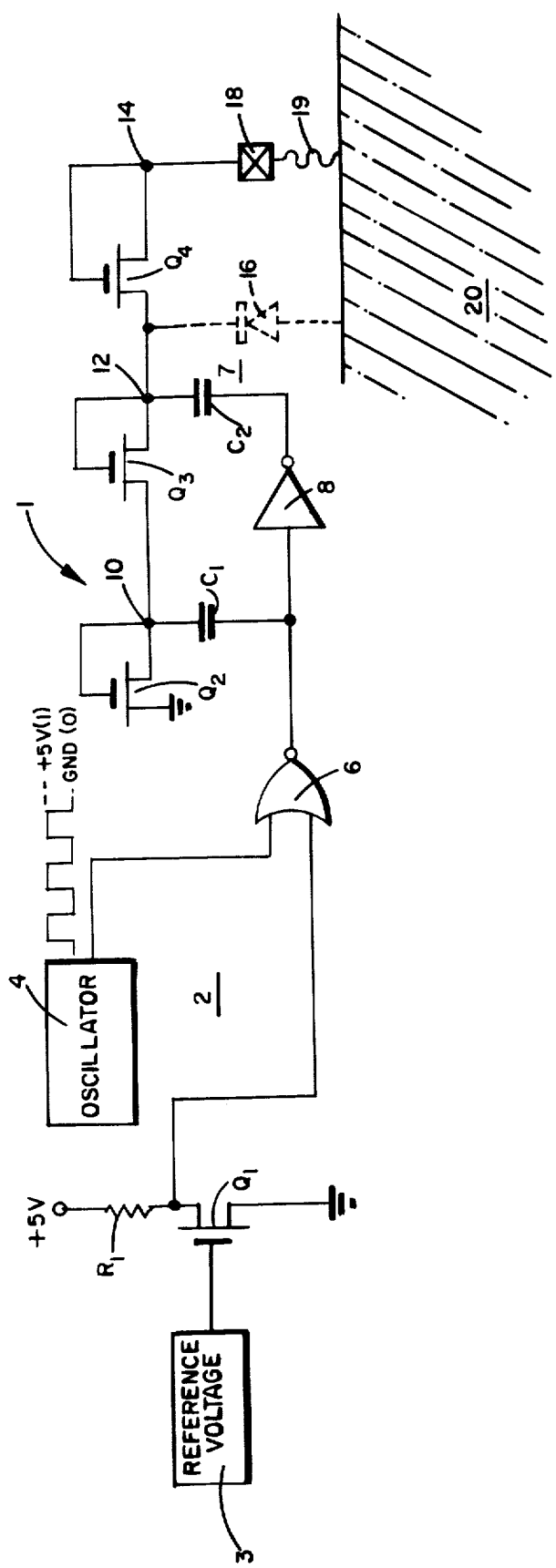

VOLTAGE BOOSTING SUBSTRATE BIAS GENERATOR

BACKGROUND OF THE INVENTION

1. Field of the Invention

This invention relates to a substrate bias generator that includes a voltage doubler (or trippler) to provide a wide range of bias feedback voltage to compensate for threshold variation in the devices which form a MOS circuit.

2. Statement of the Prior Art

Conventional substrate charge pumps or bias voltage generators are known which convert a +5 volt power supply signal to a negative substrate bias voltage. By pumping charge into the substrate, compensation is provided for variations of both operating and processing parameters (e.g. temperature change, supply voltage fluctuations, substrate leakage, etc.), which variations could undesirably cause a shift in the intrinsic threshold levels of devices that form a MOS circuit.

The following U.S. patents are illustrative of the present state of the art with respect to substrate charge pumps and bias generators:

U.S. Pat. No. 3,609,414, Pleshko
U.S. Pat. No. 3,794,862, Jenne
U.S. Pat. No. 3,805,095, Lee et al
U.S. Pat. No. 3,806,741, Smith
U.S. Pat. No. 4,004,164, Crawford et al Moreover, the following documents are listed to also indicate the present state of the art:

"Fast Mostek ROM," *Electronics*, Sept. 16, 1976, PP. 42 and 44.

"A Threshold Voltage Controlling Circuit for Short Channel MOS Integrated Circuits," Proceedings of the 1976 IEEE International Solid State Conference, Feb. 18, 1976, PP. 54-55.

"Substrate and Load Gate Voltage Compensation," Proceedings of the 1976 IEEE International Solid State Conference, Feb. 18, 1976, PP. 56-57.

"Speedy RAM Runs Cool With Power-down Circuitry," *Electronics*, Aug. 4, 1977, PP. 103-107.

However, the prior art substrate voltage generators typically provide a range of bias voltage that is insufficient to adequately regulate the threshold voltages of, especially, enhancement type field effect transistors, and, more particularly, those transistors that have their respective source electrodes connected to ground. As a result, the permissable variation of the initial threshold voltage and body constant of the transistors is undesirably limited, while power dissipation is increased.

SUMMARY OF THE INVENTION

Briefly, and in general terms, the circuit combination of a substrate bias generator and a voltage doubler (or trippler) is disclosed to develop a wide range of bias voltage that is fed back via an associated substrate to uniformly compensate for threshold variations of devices that form a MOS circuit. The preferred circuit includes a transistor level detector, an oscillator, a control gate, and the voltage doubler. The threshold of the transistor level detector is controlled by bias voltage feedback from the substrate. When the bias voltage from the substrate is sufficiently increased to thereby raise the threshold of the transistor level detector, a corresponding level detector output signal is applied to a first input terminal of the control gate. The oscillator is connected to a second input terminal of the control gate to apply one of a first or second recurring clock control signal thereto. An output terminal of the control gate supplies a particular voltage signal to the voltage doubler, depending upon the output from the level detector and the level of the oscillator output signal. Accordingly, the voltage doubler is adapted to develop a boosted negative voltage signal that is supplied to the substrate in order to regulate, by means of feedback, the threshold levels of the devices that form the MOS circuit.

BRIEF DESCRIPTION OF THE DRAWINGS

The single FIGURE of the drawings shows a preferred circuit for implementing the substrate bias generator and voltage doubler that forms the present invention.

DESCRIPTION OF THE PREFERRED EMBODIMENT

A voltage boosting substrate bias generator 1, that is capable of developing a wide range of bias voltage to be fed back via a substrate to an associated MOS circuit, is illustrated in the sole FIGURE of the drawings. The preferred circuit for implementing the voltage boosting substrate bias generator 1 of the present invention includes a reference voltage portion 2 and a voltage doubling (or trippling) portion 7.

The reference voltage portion 2 includes a reference voltage source 3 that is connected to the control electrode of a multi-terminal semiconductor device $Q_1$. In a preferred embodiment of the invention, semiconductor device $Q_1$ is an enhancement type, metal oxide (or insulated gate-polysilicon) semiconductor field effect transistor (MOSFET) that is fabricated with a very wide channel region. Thus, reference source 3 is connected to the gate electrode of FET $Q_1$. As will be explained in greater detail hereinafter, source 3 supplies a stable output reference voltage signal to the gate electrode of FET $Q_1$, which reference voltage is set to the required threshold level of FET $Q_1$. The conduction path of FET $Q_1$ is connected in electrical series with one terminal of a resistor $R_1$ and a source of reference potential, such as ground. The second terminal of resistor $R_1$ is connected to a relatively positive voltage supply, such as +5 volts d.c. In another preferred embodiment, resistor $R_1$ is a depletion type field effect transistor that is fabricated with a very long channel region. Therefore, FET $Q_1$ is selected with a very small on-resistance relative to that of resistor $R_1$. As will be recognized by those skilled in the art, FET $Q_1$ and resistor $R_1$ form a level detector (and inverter) for the reference voltage signal supplied by source 3. An electrical junction (i.e. the output terminal of the level detector) that is formed between resistor $R_1$ and FET $Q_1$ is connected to one input terminal of a NOR gate 6. The output terminal of a conventional high frequency oscillator 4 is connected to a second input terminal of NOR gate 6. The oscillator 4 is adapted to generate an output signal having first and second recurring clock signal levels (e.g. +5 volts d.c. and ground). If the oscillator 4 is fabricated on the same microelectronic chip as the bias generator circuit, it should be designed to operate while device threshold voltages and field inversion voltages are relatively low. By way of example, oscillator 4 may be conveniently mechanized by the interconnection of a ring of an odd number of MOS inverters. The output terminal of NOR gate 6 is connected to the voltage doubling circuitry 7 of the substrate bias generator 1 of the present invention.

The voltage doubling (or trippling) circuit portion 7 of bias generator 1 is described as follows. The output terminal of NOR gate 6 is connected to a common electrical junction that is formed with one plate of a first storage capacitor $C_1$ and the input terminal of a conventional inverter-amplifier 8. The output terminal of inverter 8 is connected to one plate of a second storage capacitor $C_2$. The second plate of storage capacitor $C_1$ is connected to a common electrical junction 10, and the second plate of storage capacitor $C_2$ is connected to a common electrical junction 12. The gate electrode and one conduction path electrode of a first transistor device (e.g. a MOSFET) $Q_2$ are connected together at common electrical junction 10. The second conduction path electrode of FET $Q_2$ is connected to a source of reference potential, such as ground. The gate electrode and one conduction path electrode of a second transistor device (e.g. a MOSFET) $Q_3$ are connected together at common electrical junction 12. The second conduction path electrode of FET $Q_3$ is connected to a common electrical junction 10. The gate electrode and one conduction path electrode of a third transistor device (e.g. a MOSFET) $Q_4$ are connected together at a common electrical junction 14. The second conduction path electrode of FET $Q_4$ is connected to common electrical junction 12. As will be understood by those skilled in the art, the gate and conduction path electrodes of each of FETs $Q_2$, $Q_3$, and $Q_4$ are respectively interconnected with one another so that FETs $Q_2$, $Q_3$, and $Q_4$ are electrically equivalent to three series connected diodes. The cathode electrode of a parasitic diode 16 (shown dotted) that is inherently formed between the n+ source diffusion of FET $Q_4$ and a p-substrate region 20 is connected to common electrical junction 12. The anode electrode of inherently formed parasitic diode 16 is connected to the substrate 20, which typically forms the back side of the die or chip containing the present bias generator circuit 1. Common electrical junction 14 is connected to an output bonding pad 18. Output pad 18 is connected to substrate 20 by means of any suitable well known bond 19 or similar connection.

In operation, during an initial interval of time, reference source 3 applies a suitable voltage (e.g. typically +1 volt d.c.) to the gate electrode of FET $Q_1$, which voltage is set to exceed the minimum threshold level of FET $Q_1$. FET $Q_1$ is, thereby, rendered conductive. As a result, the first input terminal of NOR gate 6 is clamped approximately to ground (i.e. indicative of a logic level "0") via the conduction path of FET $Q_1$. As previously disclosed, the output signal from oscillator 4 alternately switches between recurring first and second logic levels (i.e. ground and +5 volts). However, it is assumed that during the initial interval of time, the output terminal of oscillator 4 and the second input terminal of NOR gate 6 are driven to ground (also a logic level "0"). Hence, as will be understood by those skilled in the art, the output terminal of NOR gate 6 is driven to a signal level that is typically +5 volts d.c. (i.e. indicative of a logic level "1"). The +5 volt signal level is applied to each of the first plate of storage capacitor $C_1$ and to the input terminal of inverter 8. Accordingly, both the output terminal of inverter 8 and the first plate of storage capacitor $C_2$ are driven to ground (i.e. a logic level 0) during the initial time interval. Therefore, assuming that both of the common electrical junctions 12 and 14 are also initially at ground, FETS $Q_3$ and $Q_4$ are rendered non-conductive. However, electrical junction 10 is otherwise driven to a voltage that is slightly in excess of ground, which voltage is equivalent to the diode voltage drop (e.g. typically +1 volt d.c.) of FET $Q_2$.

During a second interval of time, the output signal from oscillator 4 switches from ground to +5 volts, whereby the first input terminal of NOR gate 6 is driven to a logic level 1. Therefore, as will be recognized by those skilled in the art, inasmuch as the second input terminal of NOR gate 6 continues to be driven to a logic level 0 via the conduction path of FET $Q_1$ during the second time interval, the output terminal of NOR gate 6 is, accordingly, also driven to a logic level 0. As a result, both the first plate of storage capacitor $C_1$ and the input terminal of inverter 8 are driven to ground during the second time interval. Since the voltage applied to the first plate of storage capacitor $C_1$ changes from +5 volts to ground during the second time interval, the voltage at the second plate of storage capacitor $C_1$ and common electrical junction 10 must also change by a corresponding amount (i.e. from +1 volt to −4 volts d.c.). Moreover, both the output terminal of inverter 8 and the first plate of storage capacitor $C_2$ are driven to a logic level 1 (i.e. +5 volts) during the second time interval. Hence, both the second plate of storage capacitor $C_2$ and common electrical junction 12 are driven to a voltage that is equivalent to the sum of the voltage at common electrical junction 10 plus the diode drop in voltage (e.g. typically +0.7 volts d.c.) of FET $Q_3$, whereby common electrical junction 12 is driven to approximately −3.3 volts. What is more, common electrical junction 14 is driven to a voltage that is equivalent to the sum of the voltage at common electrical junction 12 plus the diode drop in voltage (e.g. typically +0.4 volts d.c.) of FET $Q_4$, whereby common electrical junction 14 is driven to approximately −2.9 volts. Accordingly, during the second interval of time, the voltage at common electrical junction 14 is supplied to the substrate 20 via output pad 18 and bonding means 19. At the end of the second time interval the voltages at electrical junctions 10, 12, and 14 are preserved, as a result of the interconnections of each of FETS $Q_2$, $Q_3$, and $Q_4$ as unidirectional current conducting diodes.

During a later occurring, third interval of time, the bias voltage of substrate 20 is increased by means of the body effect of the MOS circuit devices so as to eventually reach a level that is sufficient, by means of feedback, to raise the threshold level of FET $Q_1$ in excess of the reference voltage supplied from the output terminal of source 3. As a result, FET $Q_1$ is rendered non-conductive during the third time interval, due to the unavailability of sufficient threshold potential at the gate electrode thereof. Hence, the first input terminal of NOR gate 6 is driven to a logic level 1 via resistor $R_1$. Therefore, as will also be recognized by those skilled in the art, the output terminal of NOR gate 6 is driven to a logic level 0 (and to ground), regardless of the logic level of the signal that is supplied from the output of oscillator 4 to the second input terminal of NOR gate 6. Inasmuch as the output terminal of NOR gate 6 was previously driven to a logic level 0 during the preceding second time interval, the voltage boosting action of the substrate bias generator 1 ceases for the duration of the third time interval.

Eventually, after several cycles of oscillator 4, the charge that was pumped into substrate 20 during the second time interval is leaked therefrom via the substrate leakage resistance, so that the substrate bias voltage is decreased. Accordingly, the threshold level of FET $Q_1$ returns to a voltage that is below the voltage provided by reference source 3. Therefore, FET $Q_1$ is again rendered conductive, inasmuch as the gate electrode thereof receives sufficient threshold potential from reference source 3. As a result, the first input terminal of NOR gate 16 is once again clamped approximately to ground and to a logic level 0 via the conduction path of FET $Q_1$. As previously disclosed, when the output terminal of oscillator 4 and the second input terminal of NOR gate 6 are driven to ground (and a logic level 0) concurrently with the first input terminal of NOR gate 6, both the output terminal of NOR gate 6 and the first plate of storage capacitor $C_1$ (which were previously driven to ground during the second time interval) are driven to a logic level 1 (i.e. +5 volts). What is more, both the output terminal of inverter 8 and the first plate of storage capacitor $C_2$ (which were previously driven to +5 volts during the second time interval) are driven to a logic level 0 (i.e. ground). Inasmuch as the first plate of storage capacitor $C_1$ is now driven to a relatively positive voltage level, the voltage level at both the second plate of storage capacitor $C_1$ and common electrical junction 10 changes by a corresponding positive voltage (from approximately −4 volts to +1 volt). Moreover, since the first plate of storage capacitor $C_2$ is now driven to a relatively negative voltage level, both the second plate of storage capacitor $C_2$ and common electrical junction 12 assume a voltage level that is boosted more negative (from approximately −3.3 volts to −8.3 volts). Correspondingly, the voltage at common electrical junction 14 is also boosted to a more negative signal level (from approximately −0.29 volts to −7.9 volts). Therefore, the boosted voltage signal of common electrical junction 14 is applied to the substrate 20 via output pad 18 and bonding means 19 in order to regulate (via feedback) the threshold levels of the MOS circuit devices.

The illustrated circuit for implementing the substrate bias generator 1 is of the half wave type. However, a full wave bias generator may also be mechanized by including three additional MOSFET diodes (not shown) connected in series to output pad 18 and two additional charge storage capacitors (also not shown) crosscoupled to capacitors $C_1$ and $C_2$. By virtue of the disclosed compact combination of a voltage doubler (or trippler) and a substrate bias generator circuit 1, a wide range of threshold voltages can be conveniently developed in order to uniformly compensate for threshold variations of the devices that form a MOS circuit. More particularly, the preferred voltage doubler (or trippler) circuit portion 7 generates bias voltages that can typically exceed −5 volts d.c. in the event that circuit parameters require large voltages to provide threshold regulation. Such a voltage doubler (or trippler) is advantageous for developing relatively large negative bias voltages from power supply voltages in the order of −5 volts, whereby more latitude is available in the manufacturing tolerances of MOS circuits. Moreover, by developing large negative bias voltages, greater variations are permitted in the transistor device body constant (e.g. which is a function of the substrate doping level). Hence, the cost of MOS circuit fabrication can be minimized, inasmuch as fewer circuits must be discarded for failing to meet required manufacturing specifications. What is more, circuit power dissipation and operating performance are significantly improved.

It will be apparent that while a preferred embodiment of the invention has been shown and described, various modifications and changes may be made without departing from the true spirit and scope of the invention. For example, it must be recognized that, for purposes of illustration, the operation of the present bias generator ignores the capacitive loading effect of the substrate. Therefore, many (e.g. 50–1000) oscillator clock cycles may be required to generate the final steady state value of substrate bias. Moreover, the output of the level detector (i.e. FET $Q_1$ and resistor $R_1$) may not completely switch from a logic level 0 to a logic level 2, thereby resulting in an analog or proportional control of the output signal swing of NOR gate 6. This may be desirable, inasmuch as there is less cycling up and down of the bias voltage of substrate 20 as the oscillator 4 switches between the first and second clock signal levels.

Having thus set forth a preferred embodiment of the present invention, what is claimed is:

1. A substrate bias generator circuit to develop a wide range of bias voltage to compensate for threshold variations in semiconductor devices that are formed on a substrate, said bias generator circuit comprising:

transmission gate means, level detector means responsive to an input reference voltage signal, an output terminal of said level detector means connected to an input terminal of said transmission gate means;

clock means for supplying a clock signal having first and second signal levels to another input terminal of said transmission gate means, signal level boosting means connected between an output terminal of said transmission gate means and the substrate, said signal level boosting means increasing the output signal level of said transmission gate means to be fed back to the semiconductor devices via the substrate;

said signal level boosting means comprising first and second unidirectional current conducting means connected together in electrical series between a source of supply voltage and an electrical junction, inverter means, the output terminal of said transmission gate means connected to an input terminal of said inverter means, and first and second charge storage capacitance means, said first capacitance means connected between the output terminal of said transmission gate means and a point between the connection of said first and second unidirectional current conducting means, and said second capacitance means connected between an output terminal of said inverter means and said electrical junction.

2. The substrate bias generator circuit recited in claim 1, wherein said signal level boosting means further includes a third unidirectional current conducting means connected between said electrical junction and said substrate.

3. The substrate bias generator circuit recited in claim 2, wherein each of said first, second, and third unidirectional current conducting means is a diode.

4. The substrate bias generator circuit recited in claim 2, wherein each of said first, second, and third unidirectional current conducting means is a field effect transistor respectively having the control electrode and one conduction path electrode thereof connected together.

5. A voltage boosting substrate bias generator comprising:

a substrate, transmission gate means to provide an output signal that is indicative of the bias voltage of said substrate, first and second unidirectional current conducting means connected together in electrical series between a source of supply voltage and an electrical junction, inverter means, the output terminal of said transmission gate means connected to an input terminal of said inverter means, first and second capacitance means, said first capacitance means connected between the output terminal of said transmission gate means and a point between the connection of said first and second unidirectional current conducting means, and said second capacitance means connected between an output terminal of said inverter means and said electrical junction, and third unidirectional current conducting means connected between said electrical junction and said substrate in order to supply said substrate with a bias voltage signal, the level of which signal is boosted relative to the output signal level of said transmission gate means.

* * * * *